United States Patent
Cho et al.

(10) Patent No.: US 8,239,747 B2
(45) Date of Patent: Aug. 7, 2012

(54) NONVOLATILE MEMORY DEVICES THAT UTILIZE ERROR CORRECTION ESTIMATES TO INCREASE RELIABILITY OF ERROR DETECTION AND CORRECTION OPERATIONS

(75) Inventors: Kyoung Lae Cho, Yongin-si (KR); Jae Hong Kim, Seoul (KR); Yoon Dong Park, Yongin-si (KR); Jun Jin Kong, Yongin-si (KR); Dong Hyuk Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1062 days.

(21) Appl. No.: 12/216,744

(22) Filed: Jul. 10, 2008

(65) Prior Publication Data

US 2009/0210776 A1 Aug. 20, 2009

(30) Foreign Application Priority Data

Feb. 20, 2008 (KR) ........................ 10-2008-0015310

(51) Int. Cl.
*G06F 11/00* (2006.01)

(52) U.S. Cl. ................... 714/805; 714/799; 714/800

(58) Field of Classification Search .................. 714/805, 714/799, 800
See application file for complete search history.

(56) References Cited

U.S. PATENT DOCUMENTS

| | | | |
|---|---|---|---|
| 5,475,693 A | 12/1995 | Christopherson et al. | |
| 6,233,717 B1 * | 5/2001 | Choi | 714/805 |
| 6,360,347 B1 * | 3/2002 | Walters, Jr. | 714/763 |
| 6,704,230 B1 | 3/2004 | DeBrosse et al. | |
| 7,047,478 B2 | 5/2006 | Gregori et al. | |
| 7,639,531 B2 * | 12/2009 | Cornwell et al. | 365/185.03 |
| 2008/0244349 A1 * | 10/2008 | Sukegawa | 714/746 |

FOREIGN PATENT DOCUMENTS

| | | |
|---|---|---|
| JP | 2000-251484 | 9/2000 |
| JP | 2003-100095 | 4/2003 |
| JP | 2005-267676 | 9/2005 |
| JP | 2007-048410 | 2/2007 |
| KR | 1020050064887 | 6/2005 |

OTHER PUBLICATIONS

PCT Search Report dated Dec. 22, 2008.

* cited by examiner

*Primary Examiner* — Scott Baderman
*Assistant Examiner* — Sarai Butler
(74) *Attorney, Agent, or Firm* — Myers Bigel Sibley & Sajovec, P.A.

(57) ABSTRACT

Example embodiments may provide a memory device and memory data reading method. The memory device according to example embodiments may include a multi-bit cell array, an error detector which may read a first data page from a memory page in the multi-bit cell array and may detect an error-bit of the first data page, and an estimator which may identify a multi-bit cell where the error-bit is stored and may estimate data stored in the identified multi-bit cell among data of a second data page. Therefore, the memory device and memory data reading method may have an effect of reducing an error when reading data stored in the multi-bit cell and monitoring a state of the multi-bit cell without additional overhead.

8 Claims, 9 Drawing Sheets

NONVOLATILE MEMORY DEVICES THAT UTILIZE ERROR CORRECTION ESTIMATES TO INCREASE RELIABILITY OF ERROR DETECTION AND CORRECTION OPERATIONS

PRIORITY STATEMENT

This application claims priority under 35 U.S.C. §119 to Korean Patent Application No. 2008-0015310, filed on Feb. 20, 2008 in the Korean Intellectual Property Office (KIPO), the entire contents of which are incorporated herein by reference.

BACKGROUND

1. Field

Example embodiments may relate to a method of reading data of a memory device. In particular, example embodiments may relate to a method and a device for reading data of either a multi-level cell (MLC) memory device or a multi-bit cell (MBC) memory device.

2. Description of Related Art

A single-level cell (SLC) memory device may store one bit of data in a single memory cell. The SLC memory may be referred to as a single-bit cell (SBC) memory.

Storing of one bit of data in an SLC of the SLC memory may be referred to as a programming operation that may change a threshold voltage of the SLC. The SLC may have either a low threshold voltage level or a high threshold voltage level depending on whether the one bit of data stored in the SLC is "0" or "1". Reading of data stored in the SLC may be implemented by sensing the threshold voltage level of the SLC and determining whether the sensed threshold voltage level is either higher or lower than a reference voltage level.

The threshold voltages of the programmed cells may have a distribution within a certain range due to a fine electric characteristic difference between the SLCs. For example, when a sensed voltage level of an SLC is greater than 0.5V and less than 1.5V, it may be determined that the data stored in the memory cell has a logic value of "1". When the sensed voltage level of an SLC is greater than 2.5V and less than 3.5V, it may be determined that the data stored in the memory cell has a logic value of "0".

Sensing of the threshold voltage level of the SLC may be implemented by applying a certain level of voltage to a gate terminal of the SLC, and also by sensing an amount of electric current flowing between a source terminal and a drain terminal of the SLC.

Meanwhile, a multi-level cell (MLC) memory device that can store two or more bits of data in a single memory cell has been proposed in response to a need for higher integration of memory. The MLC memory device may also be referred to as a multi-bit cell (MBC) memory.

SUMMARY

Example embodiments may provide a multi-level (or a multi-bit) data reading device and a method to reduce an error when the device reads data from a multi-level cell memory.

According to example embodiment, a new multi-level (multi-bit) reading method may be applied to a multi-level cell memory so as to provide a method to reduce an error in reading a multi-level (or a multi-bit) data.

According to example embodiments, it may be possible to minimize overhead due to monitoring a characteristic of a multi-level cell.

According to example embodiments, it may be possible to increase error correctability of data read from a memory.

According to example embodiments, a memory device may include a multi-bit cell array, an error detector which may read a first data page from a memory page in the multi-bit cell array and may detect an error-bit of the read first data page, and an estimator which may identify a multi-bit cell where the error-bit is stored and may estimate data stored in the identified multi-bit cell among data of a second data page.

According to example embodiments, a memory device may include a memory cell array, an error detector which may read data from the memory cell array and may detect an error-bit of the read data, and an estimator which may estimate a change of threshold voltages of memory cell in the memory cell array based on a pattern of detected error-bits.

Example embodiments, may provide a method of reading memory data which includes: reading a first data page from a memory page in a multi-bit cell array, detecting an error-bit of the read first data page, identifying a multi-bit cell where the detected error-bit is stored, and estimating data stored in the identified multi-bit cell among data of a second data page.

Additional aspects, features, and/or advantages of example embodiments will be set forth in part in the description which follows and, in part, will be apparent from the description, or may be learned by practice of example embodiments.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
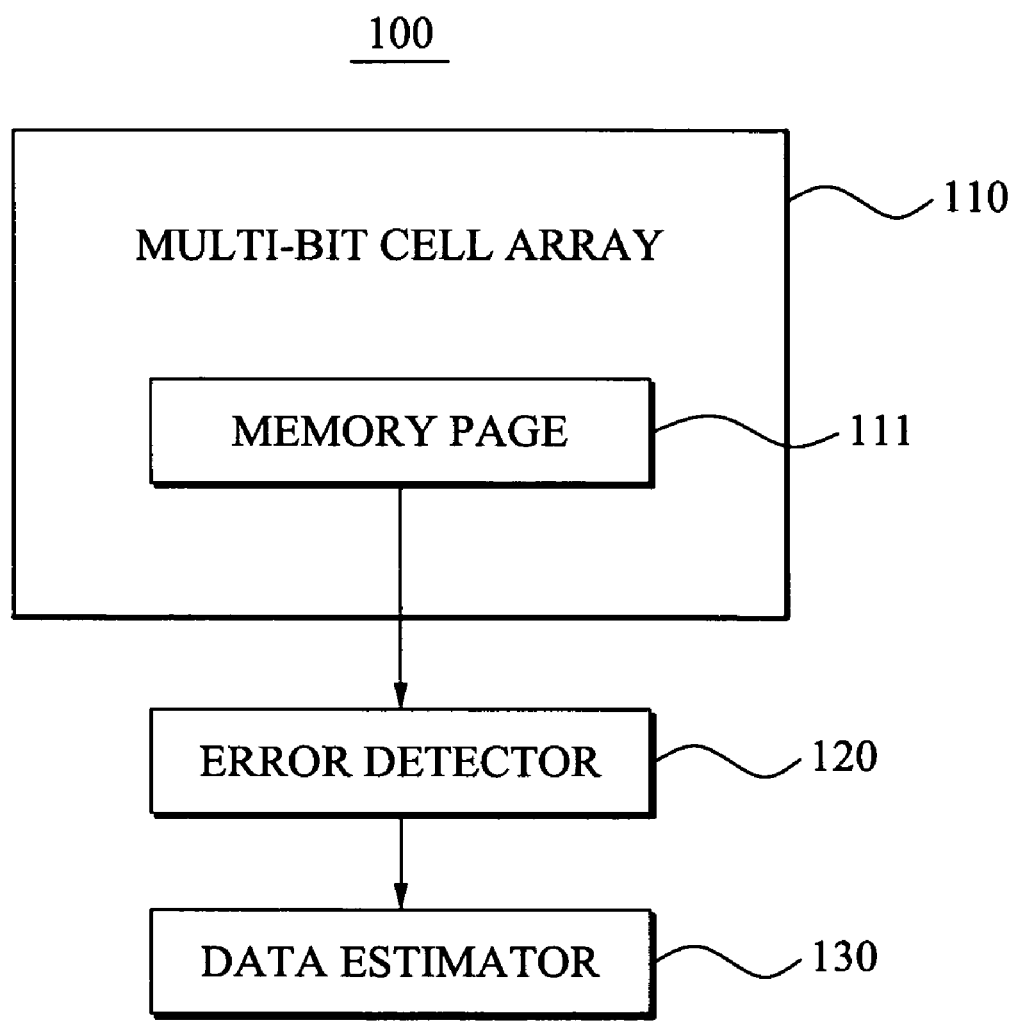
FIG. 1 illustrates a memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

As the number of bits stored in a single memory cell increases, reliability may deteriorates and a read-failure rate may increase. When the single multi-bit cell is able to store m-bit data, a threshold voltage level formed in the single multi-bit cell may be one of $2^m$ threshold voltage levels. When each of multi-bit cells in a multi-bit cell array is able to store m-bit data, a threshold voltage level of the each multi-bit cell in the multi-bit cell array may form $2^m$ distributions due to a fine electric characteristic difference of the each multi-bit cell.

Since a voltage window of the memory device may be limited, as m increases, distance between neighboring distributions may decrease, and the neighboring distributions may be overlapped. When the neighboring distributions overlap each other, the read-failure rate may increase.

An error correction codes or error control codes (ECC) scheme may be used to store data to the multi-bit cells, to detect an error occurring in reading data from the multi-bit cells, and to correct the detected error.

The ECC may be codes for detecting and correcting an error of effective information by adding a redundant bit or bits to the effective information. According to example embodiments, when the memory device stores data, the memory device may ECC encode the data and may store the ECC encoded data. According to example embodiments, the memory device may ECC-decode data read from the multi-bit cells and may extract the effective information from the ECC-decoded data.

An ECC decoding scheme may include a scheme through which the number of error-bits and locations of the error-bits in read data may be identified. Also, an ECC decoding scheme may include a scheme of correcting all errors when the errors occur within a certain rate or a certain range.

An example of codes that may clearly exhibit an error correcting capability is cyclic codes, and the like. The cyclic codes may include a Bose, Ray-Chaudhuri, Hocquenghem (BCH) codes, Reed-Solomon codes, and the like and decoding scheme thereof may include a Meggitt decoding scheme, a Berlekamp-Massey decoding scheme, an Euclid decoding scheme, and the like.

FIG. 1 illustrates a memory device 100 according to example embodiments. Referring to FIG. 1, the memory device 100 may include a multi-bit cell array 110, an error detector 120, and a data estimator 130.

The multi-bit cell array 110 may include a plurality of multi-bit cells. A single multi-bit cell may store multi-bit data. A process where the memory device 100 stores data to the single multi-bit cell may be referred to as 'programming', and the programming may be performed by using a mechanism, for example Fowler-Nordheim tunneling (FN-tunneling).

The programming operation may change a threshold voltage of the multi-bit cell. When the single multi-bit cell is able to store a maximum of m-bit data, a threshold voltage level formed in the single multi-bit cell may be one of $2^m$ threshold voltage levels.

The memory device 100 may simultaneously read data from a plurality of neighboring multi-bit cells to reduce time consumed when reading data from the multi-bit cell array 110. According to example embodiments, a group of the plurality of multi-bit cells that are simultaneously read by the memory device 100 may be referred to as a memory page 111. The single memory page 111 may be a group of multi-bit cells connected to a word line.

The m-bit data stored in the single multi-bit cell may be aligned from a most significant bit (MSB) to a least significant bit (LSB). The memory device 100 may read data from the multi-bit cell sequentially from an MSB to a lowest bit that is the LSB. According to example embodiments, the LSB may be read last.

According to example embodiments, the memory device 100 may read data from the multi-bit cell sequentially from an LSB to a highest bit that is the MSB. According to example embodiments, the MSB may be read last.

The memory device 100 may read data from each of multi-bit cells in the memory page 111 sequentially from an MSB to a lowest bit that is the LSB. A group of MSBs read from each of the multi-bit cells of the memory page 111 may be a single data page.

The memory device 100 may read LSBs from the each of the multi-bit cells of the memory page 111. A group of LSBs read from the each of the multi-bit cells of the memory page 111 may be another single data page.

If each of multi-bit cells in the memory data page 111 is able to store m-bit data, m data pages may be stored in the memory page 111. The memory device 100 may read m data pages from the memory page 111. According to example embodiments, a first data page may correspond to the MSB, a second data page may correspond to a second bit, and a third data page may correspond to the LSB.

The error detector 120 may read the first data page from the memory page 111, and may detect an error-bit of the read first data page.

The data estimator 130 may identify a multi-bit cell where the detected error-bit is stored, and may estimate data stored in the identified multi-bit cell among data of the second data page.

According to example embodiments, the memory device 100 may read data from a single multi-bit cell sequentially from an LSB to a highest bit that is the MSB. According to example embodiments, an MSB may be read last. Additionally, a first data page may correspond to the LSB, a second data page may correspond to a second bit, and a third data page may correspond to the MSB.

Figure 2:
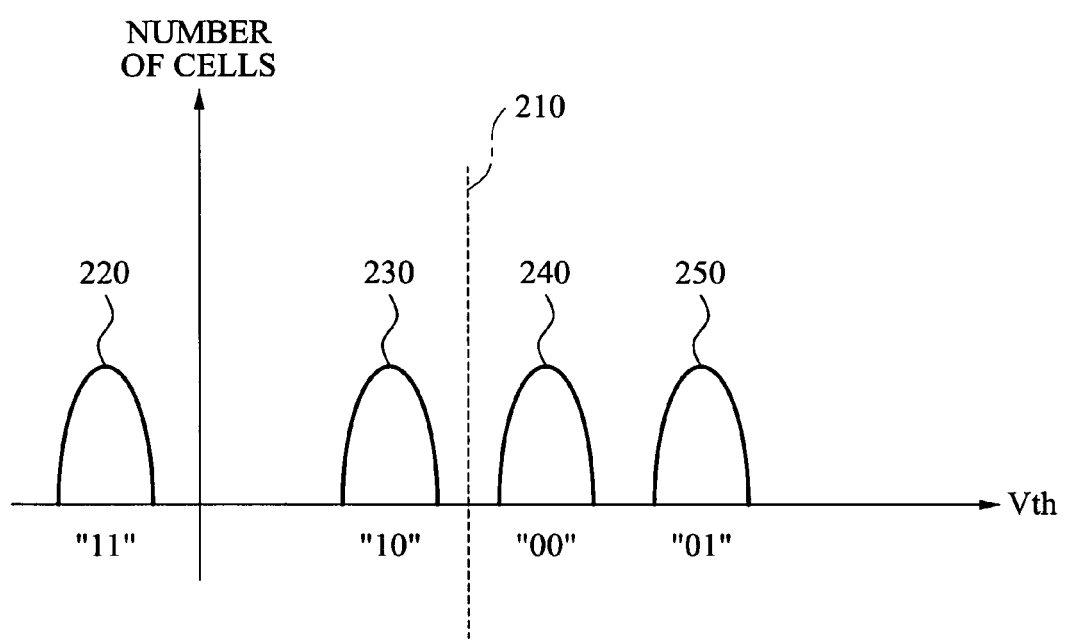
FIG. 2 illustrates an example of a data estimating process of a data estimator of FIG. 1 according to example embodiments.

FIG. 2 illustrates an example of a data estimating process of a data estimator 130.

Referring to FIG. 2, a horizontal axis is a threshold voltage of a multi-bit cell and a vertical axis is a number of the multi-bit cells that have a corresponding threshold voltage. Referring to FIG. 2, each of multi-bit cells in a multi-bit cell array 110 are illustrated storing 2-bit data.

Threshold voltages of multi-bit cells that store data "11" may form a distribution 220, threshold voltages of multi-bit cells that store data "10" may form a distribution 230. Threshold voltages of multi-bit cells that store data "00" may form a distribution 240, threshold voltages of multi-bit cells that store data "01" may form a distribution 250.

An error detector 120 may compare a voltage level 210 with each of the threshold voltages of the multi-bit cells. The error detector 120 may determine an MSB of the multi-bit cells that has higher threshold voltage than the voltage level 210 as "0" and may determine an MSB of the multi-bit cells that has lower threshold voltage than the voltage level 210 as "1".

When a certain amount of time passes after data is stored in the multi-bit cell array 110, there may be a possibility that the stored data in the multi-bit cell array may be corrupted. For example, if a threshold voltage of the multi-bit cell where data "00" is stored becomes lower as time passes so that the threshold voltage of the multi-bit cell becomes lower than the voltage level 210, the error detector 120 may wrongfully determine the MSB stored in the multi-bit cell as "1". The error detector 120 may check an error of a first data page read from a memory page 111, and may detect that the MSB read from the multi-bit cell which is supposed to store the MSB "0" has been determined as "1" based on the error checking result. A data estimator 130 may identify the multi-bit cell where the detected error MSB is stored.

That is, upon checking an error of the read first data page, if the error detector 120 detects that the determined data "1" is an error-bit, the data estimator 130 and/or the error detector 120 may correct the detected error-bit to "0", and the data estimator 130 may identify the multi-bit cell where the detected error-bit is stored.

The data estimator 130 may estimate the LSB stored in the identified multi-bit cell from the process of the error detector 120 detecting an error of the first data page corresponding to the MSB. Based on mapping a relationship between data and a threshold voltage in the multi-bit cell array 110, the data estimator 130 may estimate that if there was no error in threshold voltage stored in the identified multi-bit cell, the threshold voltage of the multi-bit cell where detected error-bit is stored would correspond to the distribution 240. This estimation may be possible since a possibility that the threshold voltage of the multi-bit cell corresponding to the distribution 240 may become lower than the voltage level 210 may be significantly higher than a possibility that the threshold voltage of the multi-bit cell corresponding to the distribution 250 may become lower than the voltage level 210, because the distribution 250 is farther from the voltage level 210 than the distribution 240.

The error detector 120 may detect an error of the first data page corresponding to the MSB using the voltage level 210, and the data estimator 130 may identify the multi-bit cell where the detected error is stored and may correct the MSB stored in the identified multi-bit cell to "0". The data estimator 130 may estimate the LSB stored in the identified multi-bit cell as "0" because the identified multi-bit cell may have a high possibility of corresponding to the distribution 240 if there was no error in the identified multi-bit cell.

Additionally, a threshold voltage of the multi-bit cell where data "10" is stored may become higher than the voltage level 210 over time or as threshold voltages of neighboring multi-bit cells are changed. The error detector 120 may read the first data page corresponding to the MSB using the voltage level 210, and may detect an error-bit of the read first data page. When the threshold voltage of the multi-bit cell where data "10" is stored is higher than the voltage level 210, the MSB stored in the multi-bit cell may be determined as "0". When the error detector 120 detects "0" as an error-bit from the read first data page, the data estimator 130 may identify the multi-bit cell where the detected error-bit "0" is stored and may estimate that the data stored in the identified multi-bit cell is "10". This estimation may be possible because a possibility that the threshold voltage of the multi-bit cell corresponding to distribution 230 may become higher than the voltage level 210 is significantly higher than a possibility that the threshold voltage of the multi-bit cell corresponding to 220 may become higher than the voltage level 210, because the distribution 220 is farther from the voltage level 210 than the distribution 230.

The error detector 120 may detect an error-bit of the MSB, and the data estimator 130 may estimate a corrected MSB and strongly estimate an LSB in advance based on a pattern of detected error-bits and also based on a mapping relationship between stored data and threshold voltage. If the error detector 120 detects more error-bit "0" than error-bit "1" of the MSBs, the data estimator 130 may conclude that a tendency of threshold voltage to decrease is superior to a tendency of threshold voltage to increase. The data estimator 130 may estimate an LSB in advance referring to the superiority of the tendency of threshold voltage to decrease.

In FIG. 2, according to example embodiments, the LSB of the multi-bit cell where the detected error-bit of the MSB is stored may be estimated as "0". The error detector 120 may read a second data page corresponding to the LSB from the memory page 111, and may detect an error from the read second data page. According to example embodiments, the error detector 120 may easily detect the error of the second data page using the LSB estimated by the data estimator 130. The error detector 120 may perform ECC decoding on the read second data page. The error detector 120 may give high priority to the LSB estimated by the data estimator 130, and perform ECC decoding using the given priority. That is, the error detector 120 may detect the error of the second data page assuming that the LSB estimated by the data estimator 130 is definitely correct and the possibility of occurring error in the LSB estimated by the data estimator 130 is very low.

Figure 3:
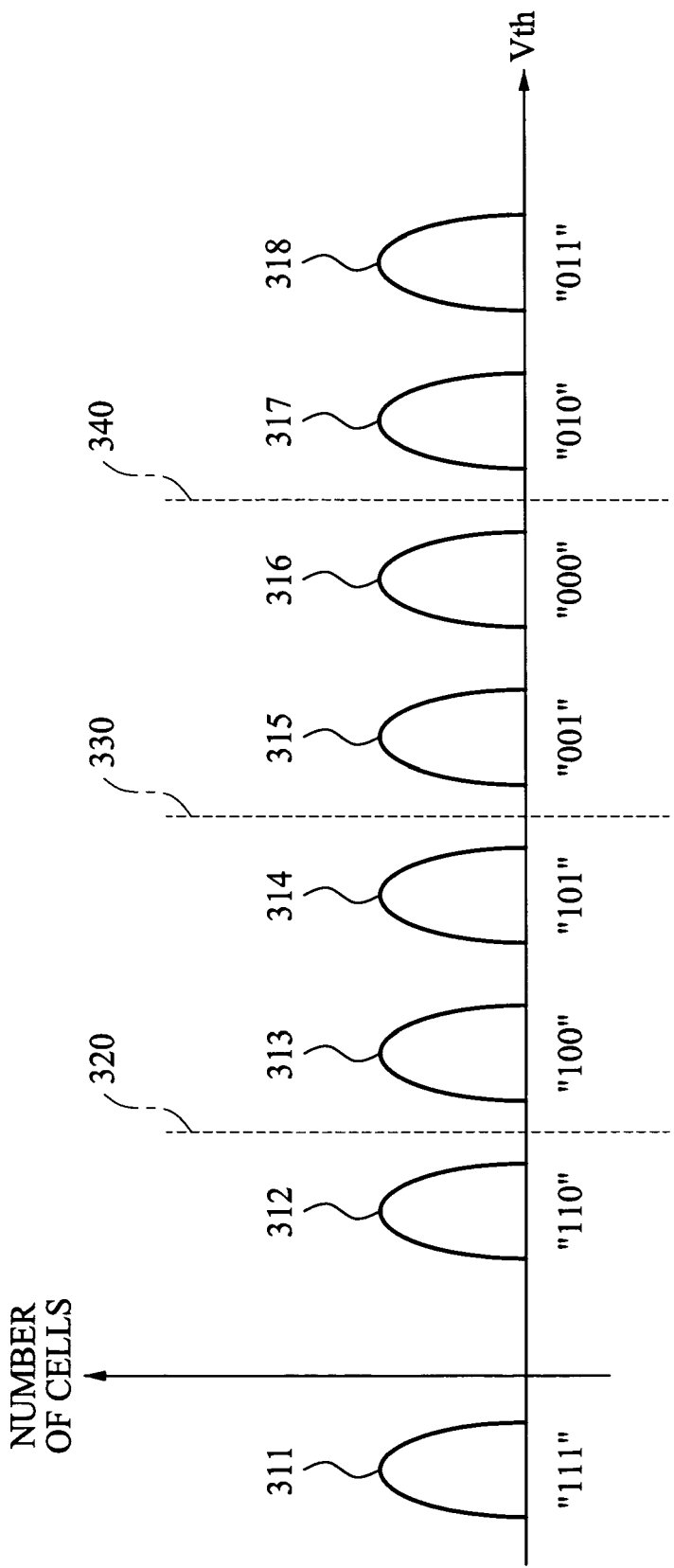
FIG. 3 illustrates another example of a data estimating process of the data estimator of FIG. 1 according to example embodiments.

FIG. 3 illustrates another example of a data estimating process of a data estimator 130.

Referring to FIG. 3, a horizontal axis is a threshold voltage of a multi-bit cell and a vertical axis is the number of the multi-bit cells that have a corresponding threshold voltage.

Threshold voltages of multi-bit cells that store data "111" may form a distribution 311, and threshold voltages of multi-bit cells that store data "110" may form a distribution 312. Threshold voltages of multi-bit cells that store data "100" may form a distribution 313, and threshold voltages of multi-bit cells that store data "101" may form a distribution 314.

Threshold voltages of multi-bit cells that store data "001" may form a distribution 315, and threshold voltages of multi-bit cells that store data "000" may form a distribution 316. Threshold voltages of multi-bit cells that store data "010" may form a distribution 317, and threshold voltages of multi-bit cells that store data "011" may form a distribution 318.

An error detector 120 may read a first data page corresponding to an MSB from a memory page 111 using a voltage level 330. The error detector 120 may detect an error-bit of the read first data page.

A data estimator 130 may identify a multi-bit cell where the error-bit is stored. Referring to FIG. 3, because the identified multi-bit cell may have a high possibility of corresponding to the distribution 314 or the distribution 315, the data estimator 130 may estimate a second bit stored in the identified multi-bit cell as "0" and may estimate an LSB stored in the identified multi-bit cell as "1".

The error detector 120 may read a second data page corresponding to the second bit from the memory page 111 using a voltage level 320 and a voltage level 340. The error detector 120 may detect an error-bit from the read second data page. The error detector 120 may detect the error-bit from the read second data page using the second bit estimated by the data estimator 130.

If the error detector 120 reads the second bit "0" from the multi-bit cell identified by the data estimator 130 as a result of reading the second data page, the read second bit "0" may be identical to the second bit "0" estimated by the data estimator 130. Thus, the error detector 120 may regard the second bit "0" of the identified multi-bit cell and detect an error of a second bit of other multi-bit cells.

In an example embodiment described with reference to FIG. 3, because the process of reading the first data page uses the single voltage level 330, and the process of reading the second data page uses the two voltage levels 320 and 340, a possibility of an error in the second data page may be higher than that of the first data page. The error detector 120 may use the second bits that were previously estimated with respect to certain multi-bit cells in an error detection process of the second data page, wherein the multi-bit cells associated with the estimated second bits may be identified by the data estimator 130, so as to increase effect of the error detection process.

The error detector 120 may detect the error-bit from the second data page using the voltage levels 320 and 340. According to example embodiments, the multi-bit cell where the detected error-bit is stored may correspond to either the distribution 312 or the distribution 313 that are near the voltage level 320 and may correspond to either the distribution 316 or the distribution 317 that are near the voltage level 340. Thus, the data estimator 130 may identify the multi-bit cell where the detected error-bit is stored and may estimate the LSB of the identified multi-bit cell as "0".

The error detector 120 may read a third data page corresponding to the LSB from the memory page 111, and detect an error-bit from the read third data page. According to example embodiments, the error detector 120 may use the LSB estimated by the data estimator 130 so as to increase efficiency of the error detection process, wherein the LSB may be estimated in the error detection process of the first and the second data page.

The error detection process of the first, the second, and the third data page read by the error detector 120 may be an ECC decoding process. The error detector 120 may ECC-decode the read first, second, and third data page, and may detect an error-bit of each data page.

As described above description, the ECC-decoding process using the cyclic codes may correct all errors when the errors do not exceed the error correcting capability. When the number of the detected error-bits exceeds the error correcting capability, the error detector 120 may adjust read voltage levels and may read data from the memory page 111 again. The error correcting capability may be represented by, for example, a maximum number of errors that may be corrected by the ECC-decoding process.

The memory page 111 may be a group of multi-bit cells connected to a single word line. The word line may be connected to a gate terminal of each of the multi-bit cells in the memory page 111. The error detector 120 may adjust a voltage applied to the word line so as to adjust the read voltage levels.

When the threshold voltage of the multi-bit cell is expected to be lower by a charge loss mechanism, the error detector 120 may lower the voltage applied to the word line and may additionally read data from the memory page 111.

Referring to FIG. 3, wherein the first data page corresponds to the MSB, the second data page corresponds to the second bit, and the third data page corresponds to the LSB, according to example embodiments the error detector 120 may read the first data page using the single voltage level 330.

The error detector 120 may read the second data page using the two voltage levels 320 and 340. In the reading process of the first data page, the multi-bit cells corresponding to the distributions 314 and the distribution 315 may have a high possibility of having an error and in the reading process of the second data page, the multi-bit cells corresponding to the distribution 312, the distribution 313, the distribution 316, and the distribution 317 may have a high possibility of having error. Thus, the possibility of errors occurring in the second data page may be higher than that of the first data page.

According to example embodiments, the error detector 120 may detect a first data page that has lower bit error rate (BER), and detect an error-bit from the read first data page. The data estimator 130 may estimate a part of data of a second data page from the error-bit of the first data page. The estimated data of the second data page by the data estimator 130 may be error-corrected data. According to example embodiments, a BER of the second data page may be higher than a BER of the first data page. The error detector 120 may read the second data page, and detect an error-bit of the read second data page using the part of the data of the second data page estimated by the data estimator 130. Because the data estimator 130 may previously estimate the part of the data in the second data page (because the part of the data in the second data page may be previously corrected), even when the BER of the second data page is high, the error detector 120 may effectively detect the error-bit of the second data page and effectively correct the detected error-bit.

Referring to FIG. 3, according to example embodiments, because in the process of reading the third data page, the multi-bit cells corresponding to eight distributions 311, 312, 313, 314, 315, 316, 317, and 318 may have a high possibility of having an error, the third data page may be easily predicted to have a higher BER than that of the second data page.

The data estimator 130 may previously detect and correct a portion of the errors of the multi-bit cells corresponding to the distribution 314 and the distribution 315 (a portion of the errors in the second data page and the third data page) using an error-bit of the first data page, and also may detect and correct a portion of the errors of the multi-bit cells corresponding to the distribution 312, the distribution 313, the distribution 316, and the distribution 317 (a portion of the errors of the third data page) using an error-bit of the second data page. The error detector 120 may read the third data page, and detect and correct an error-bit of the third data page of the read third data page using a portion of the third data page estimated by the data estimator 130. Thus, even though a BER of the third data page may be high, the errors of the third data page may be effectively corrected.

Figure 4:
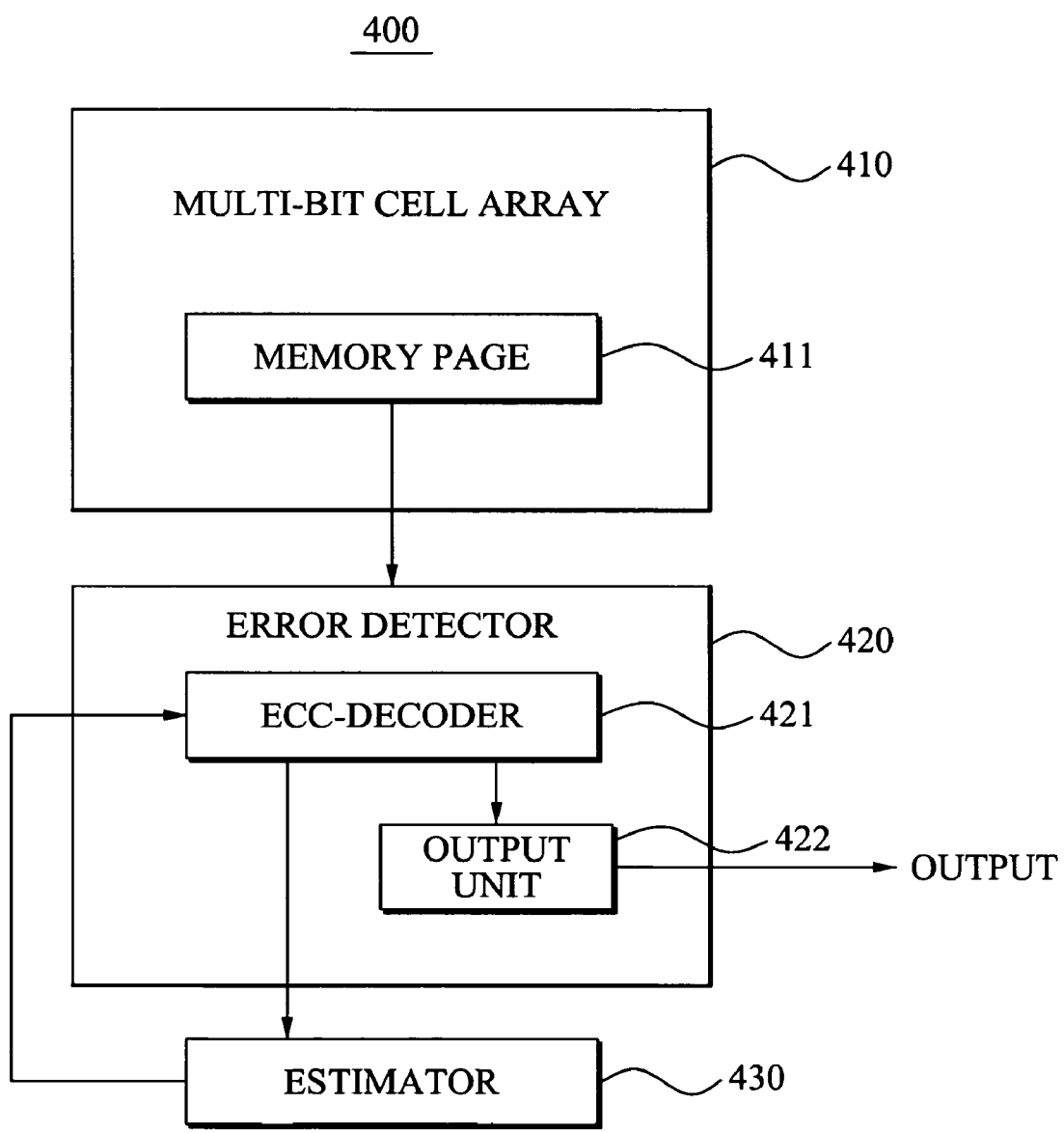
FIG. 4 illustrates a memory device according to example embodiments.

FIG. 4 illustrates a memory device 400 according to another example embodiment.

Referring to FIG. 4, the memory device 400 may include a multi-bit cell array 410, an error detector 420, and an estimator 430.

The multi-bit cell array 140 may include a memory page 411. Although the single memory page 411 is illustrated in FIG. 4, the multi-bit cell array 410 may include a plurality of memory pages (not shown).

The error detector 420 may read a first data page from the memory page 411 and detects an error-bit from the read first data page.

The estimator 430 may identify a multi-bit cell where the detected error-bit is stored and may estimate the data stored in the identified multi-bit cell. The estimated data may be all data stored in the identified multi-bit cell.

For example, when 4-bit data is stored in the multi-bit cell identified in the error detection process of the first data page, the estimator 430 may estimate all the 4-bit data stored in the identified multi-bit cell. More generally, when m data pages are stored in the memory page 411, the estimator 430 may estimate the whole m-bit data stored in the identified multi-bit cell.

The estimator 430 may transmit the estimated data to the error detector 420.

The error detector 420 may use data estimated by the estimator 430 when detecting errors in a second data page and a third data page. More generally, if m data pages are stored in the memory page 411, the estimator 430 may estimate data of $(k+1)^{th}$ data page through $m^{th}$ data page while the error detector 420 may detect $k^{th}$ data page ($1 \leq k \leq m$). The error detector 120 may use the data estimated by the data estimator 130 when detecting error in the $(k+1)^{th}$ data page through the $m^{th}$ data page.

The error detector 420 may include an ECC-decoder 421 and an output unit 422.

The ECC-decoder 421 may ECC-decode the read first data page and detect an error-bit of the read first data page. The ECC-decoder 421 may detect the number of error-bits and the location of the error-bits of the read first data page that is read by using an ECC-decoding method using cyclic codes.

The ECC-decoder 421 may correct the detected error-bit and transmit the error-corrected first data page to the output unit 422.

The output unit 422 may output the error-corrected first data page.

The ECC-decoder 421 may transmit the detected location of the error-bit to the estimator 430.

The ECC-decoder 421 may ECC-decode the second data page using data estimated by the estimator 430. Because the data estimated by the estimator 430 may be regarded as error-corrected data, the ECC-decoder 421 may assign log likelihood ratio (LLR) that is relatively high to the estimated data and ECC-decode the second data page.

Figure 5:
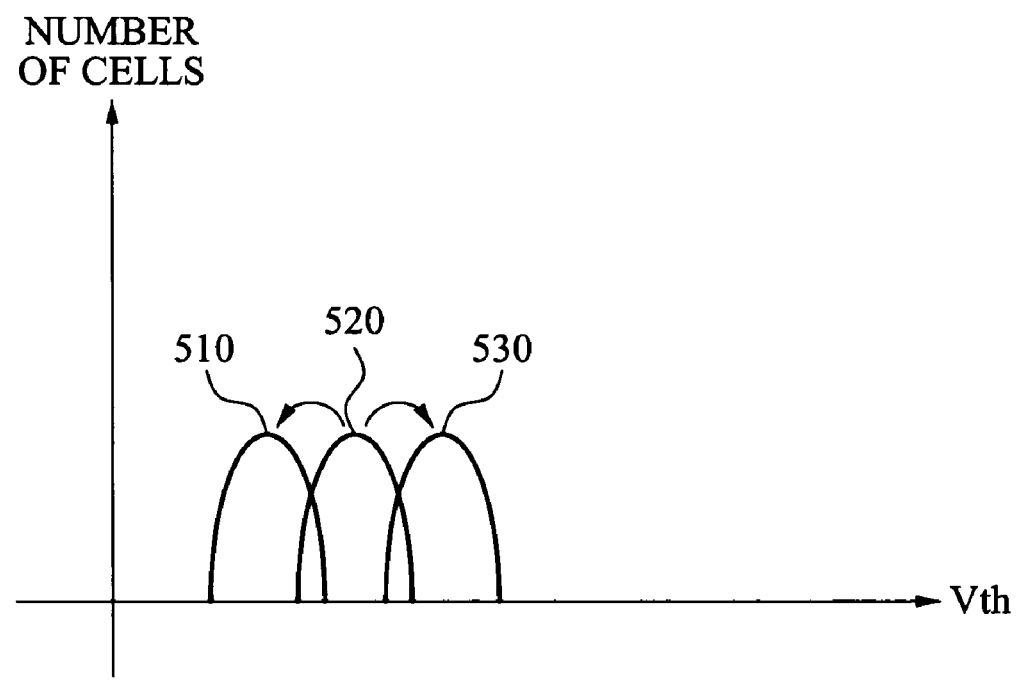
FIG. 5 illustrates an example of a changing process of threshold voltages of multi-bit cells.

FIG. 5 illustrates an example of a changing process of threshold voltages of multi-bit cells.

Referring to FIG. 5, a horizontal axis is a threshold voltage of multi-bit cells and a vertical axis is the number of the multi-bit cells that has a corresponding threshold voltage.

Multi-bit cells where a specific data is stored may correspond to a distribution 520. The threshold of voltage of the multi-bit cells corresponding to the distribution 520 may change over time, or as threshold voltages of neighboring multi-bit cells are changed.

If the threshold voltages of the multi-bit cells become lower over time, the threshold voltage of the multi-bit cells may form a distribution 510 after an amount of time passes.

If the threshold voltages of multi-bit cells become higher as the threshold voltages of the neighboring multi-bit cells becomes high (due to programming operations of the neighboring multi-bit cells, and the like), the threshold voltages of the multi-bit cells may form a distribution 530 after an amount of time passes.

Threshold voltage of the multi-bit cells may become lower as time passes due to a charge loss mechanism.

The multi-bit cell may have a structure wherein an insulator may be located between a control gate (CG) and a floating gate (FG), and another insulator may be located between the FG and a substrate. A memory device may apply a voltage to the CG and the substrate of the multi-bit cell so as to electrically charge or discharge the FG The electrical charging or discharging of the FG may be performed by a mechanism, for example F-N tunneling, hot-carrier effect, and the like. A charge charged in the FG should be maintained in the FG unless it is under an electric discharging condition. However, the charge in the FG may decrease due to dispersion of the charge by diffusion or the FG may lose the charge when a leaking path of the charge is formed due to damage and/or imperfections in the insulator around the FG.

In general, the charge loss mechanism wherein the charged FG loses the charge may tend to lower a threshold voltage of a multi-bit cell.

A threshold voltage of a central multi-bit cell being affected by a change of threshold voltages of neighboring multi-bit cells may be referred to as a floating gate coupling (FG coupling) mechanism. The threshold voltage of center multi-bit cells may be affected by a coupling of a parasitic capacitance among FGs of the multi-bit cells.

When a programming operation increases the threshold voltage of multi-bit cells, the threshold voltage of the central multi-bit cell may increase to be more than a desired value due to the FG coupling.

A distribution of the threshold voltage of multi-bit cells may tend to be spread due to mechanisms, for example FG coupling mechanism, and the like. In general, a large change of a threshold voltage caused by the FG coupling may occur when the threshold voltage is low.

Since a voltage window where the multi-bit cells are operated may be limited, as the distribution of the threshold voltage spreads, a distance to distributions of the neighboring threshold voltage may decrease. Therefore, a possibility that a boundary line of the distribution of the threshold voltage may be overlapped may become higher. As an overlapped area of the distribution of the threshold voltage increases, an error rate may increase when reading data stored in the multi-bit cells.

Figure 6:
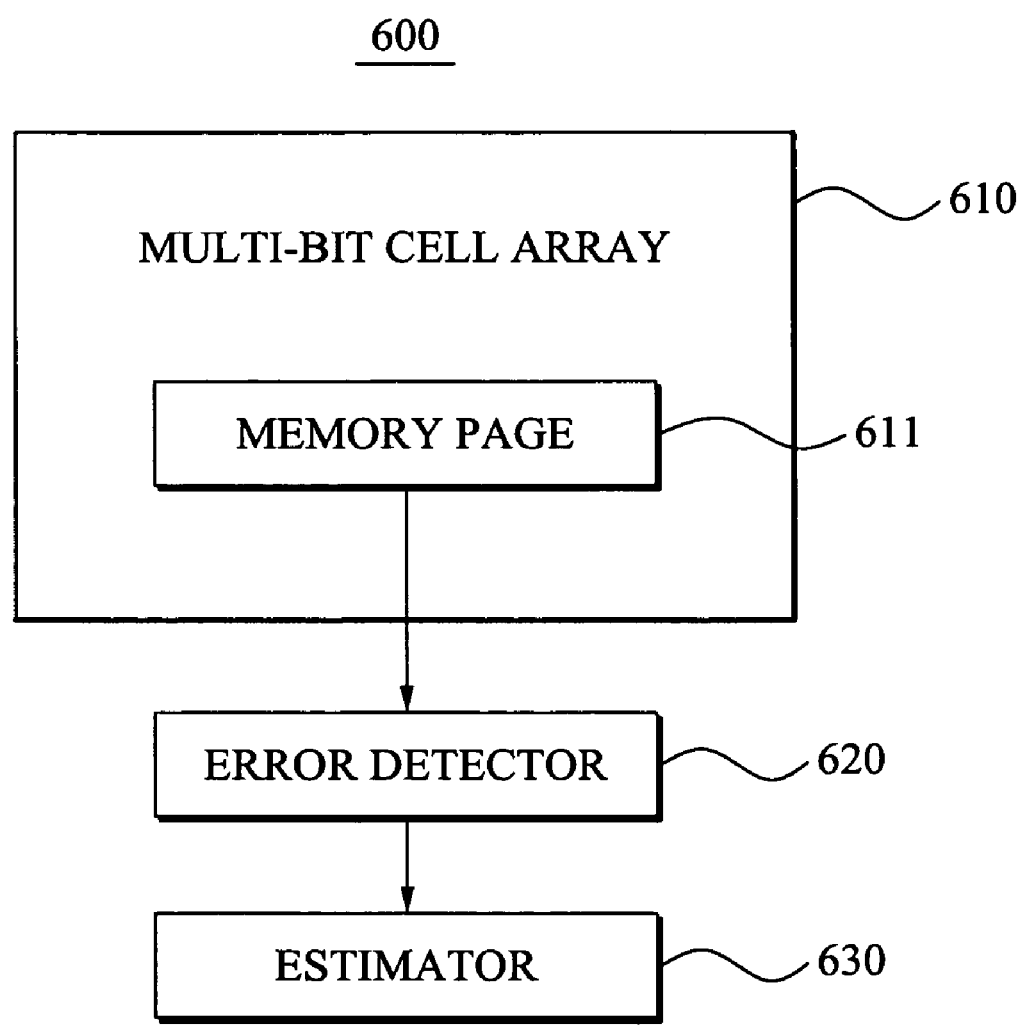
FIG. 6 illustrates a memory device according to example embodiments.

FIG. 6 illustrates a memory device 600 according to still another example embodiment.

Referring to FIG. 6, the memory device 600 may include a multi-bit array 610, an error detector 620 and an estimator 630.

The multi-bit cell array 610 may further include a plurality of memory pages (not shown), in addition to a memory page 611. The memory page 611 may include a plurality of multi-bit cells. The memory device 600 may simultaneously read data stored in the multi-bit cell of the memory page 611.

The error detector 620 may read data from the memory page 611 and detect an error-bit from the read data.

The estimator 630 may estimates a change of a threshold voltage of the multi-bit cell in the memory page 611 based on a pattern of detected error-bits.

Figure 7:
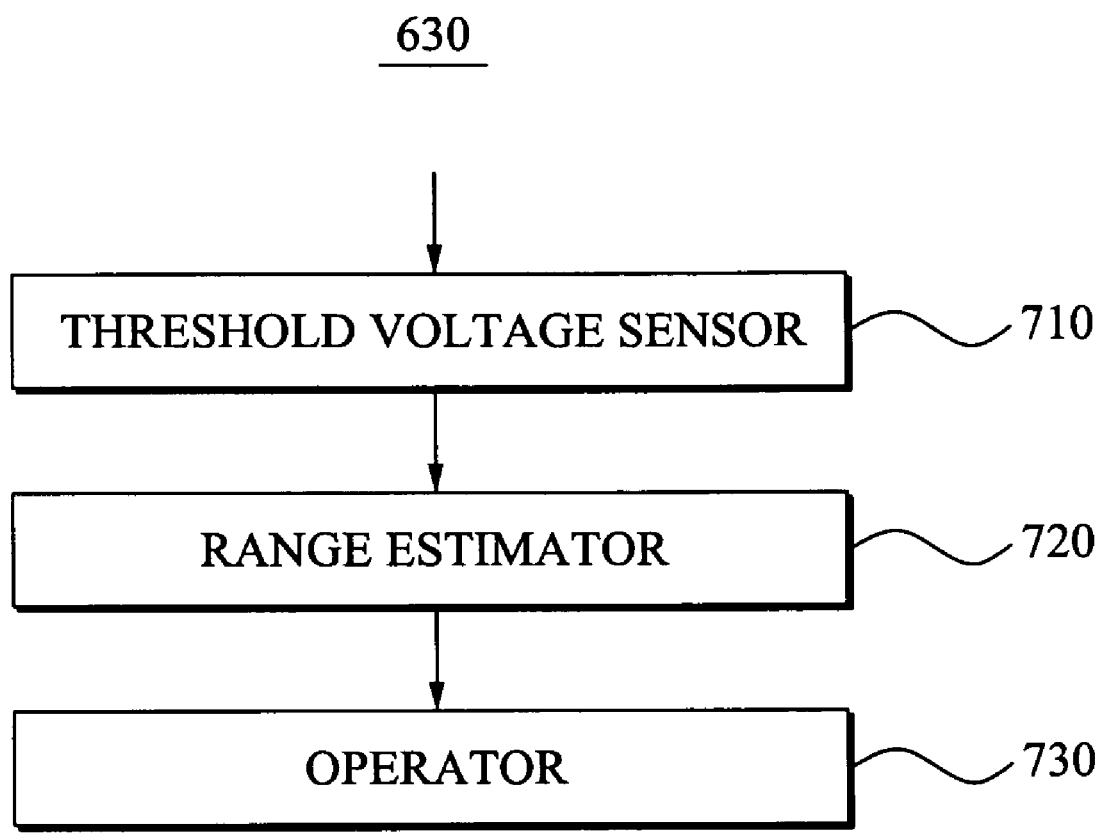
FIG. 7 illustrates an example of an estimator of FIG. 6 according to example embodiments.

FIG. 7 illustrates an example of the estimator 630 of FIG. 6.

Referring to FIG. 7, the estimator 630 may include a threshold voltage sensor 710, a range estimator 720, and an operator 730.

The threshold voltage sensor 710 may identify a multi-bit cell where an error-bit detected by an error detector 620 is stored. The threshold voltage sensor 710 may sense a threshold voltage of the identified multi-bit cell or a range of the threshold voltage.

According to example embodiments, in a process where the error detector 620 reads data stored in the multi-bit cell in a memory page 611, a threshold voltage of each of the multi-bit cells may be sensed. According to example embodiments, the threshold voltage sensor 710 may newly sense the threshold voltage or may use the threshold voltage sensed by the error detector 620 without newly sensing the threshold voltage.

The range estimator 720 may estimate a corrected threshold voltage range of the identified multi-bit cell based on a pattern of error-bits detected by the error detector 620.

An estimating process in which the range estimator 720 may estimate the range of the threshold voltage may be explained using FIG. 3. Although FIG. 3 illustrates an operation of a data estimator 130 of FIG. 1, it may similarly describe an operation of the range estimator 720.

The error detector 620 may detect the error bits among data that is simultaneously read using ECC-decoding method using cyclic codes. The error detector 620 may read data stored in multi-bit cells in the memory page 611, and may ECC-decode the read data. The ECC-decoding method using the cyclic codes may include a method through which the number of error-bits and location of the error-bits may be identified. The error detector 620 may ECC-decode the read data to correct the error bits and may identify the number of the corrected bits and location of the corrected bits.

The error detector 620 may read an MSB stored in the multi-bit cells in the memory page 611 using a voltage level 330. When one of bits read as "1" is detected as an error-bit, the error detector 620 and the range estimator 720 may identify that a correct value of the detected bit is "0".

The error-bit may indicate that the threshold voltage of the multi-bit cell programmed to store the MSB "0" becomes lower than the voltage level 330. The threshold voltage sensor 710 may identify the multi-bit cell where the error-bit is stored. According to example embodiments, the threshold voltage sensor 710 may determine that the threshold voltage of the identified multi-bit cell is lower than the voltage level 330. According to example embodiments, the threshold voltage sensor 710 may perform an additional reading operation, thereby sensing the threshold voltage of the identified multi-bit cell. According to example embodiments, the threshold voltage sensor 710 may use threshold voltage information obtained from an operation where the error detector 620 reads all the data stored in multi-bit cells in the memory page 611, thereby sensing the threshold voltage of the identified multi-bit cell.

The range estimator 720 may estimate the threshold voltage of the identified multi-bit cell at the time of programming based on the fact that the identified multi-bit cell is initially programmed to have higher threshold voltage than the voltage level 330, however, as time passes, the threshold voltage of the identified multi-bit cell may become lower so that it is lower than the voltage level 330.

A possibility that a threshold voltage programmed to correspond to a distribution 316 may become lower than the voltage level 330 may be significantly lower than a possibility that a threshold voltage programmed to correspond to a distribution 315 may become lower than the voltage level 330.

The range estimator 720 may estimate that the threshold voltage of the identified multi-bit cell at the time of programming was included in a range of the distribution 315. According to example embodiments, the range estimator 720 may estimate that a range of the threshold voltage of the identified multi-bit cell at the time of programming was in the range of the distribution 315.

The operator 730 may calculate a range difference between the threshold voltage sensed by the threshold voltage sensor 710 and the estimated threshold voltage by the range estimator 720, and may estimate a change of the threshold voltage of the identified multi-bit cell from the calculated result.

Also, the operator 730 may estimate the change of the threshold voltage of the multi-bit cell in the multi-bit cell array 610 from a ratio of MSB error bits that are detected as "1" when the error detector 620 reads the MSB of the multi-bit cells in the multi-bit cell array 610.

According to example embodiments, a memory device 600 may not need overhead, for example additional data storage area when estimating a change of a threshold voltage of multi-bit cells.

Although the memory device 600 of FIG. 6 may include the multi-bit cell array 610, the disclosed example embodiments are not limited to a memory using a multi-bit cell, and may also be applicable to a memory using a single-bit cell.

Figure 8:
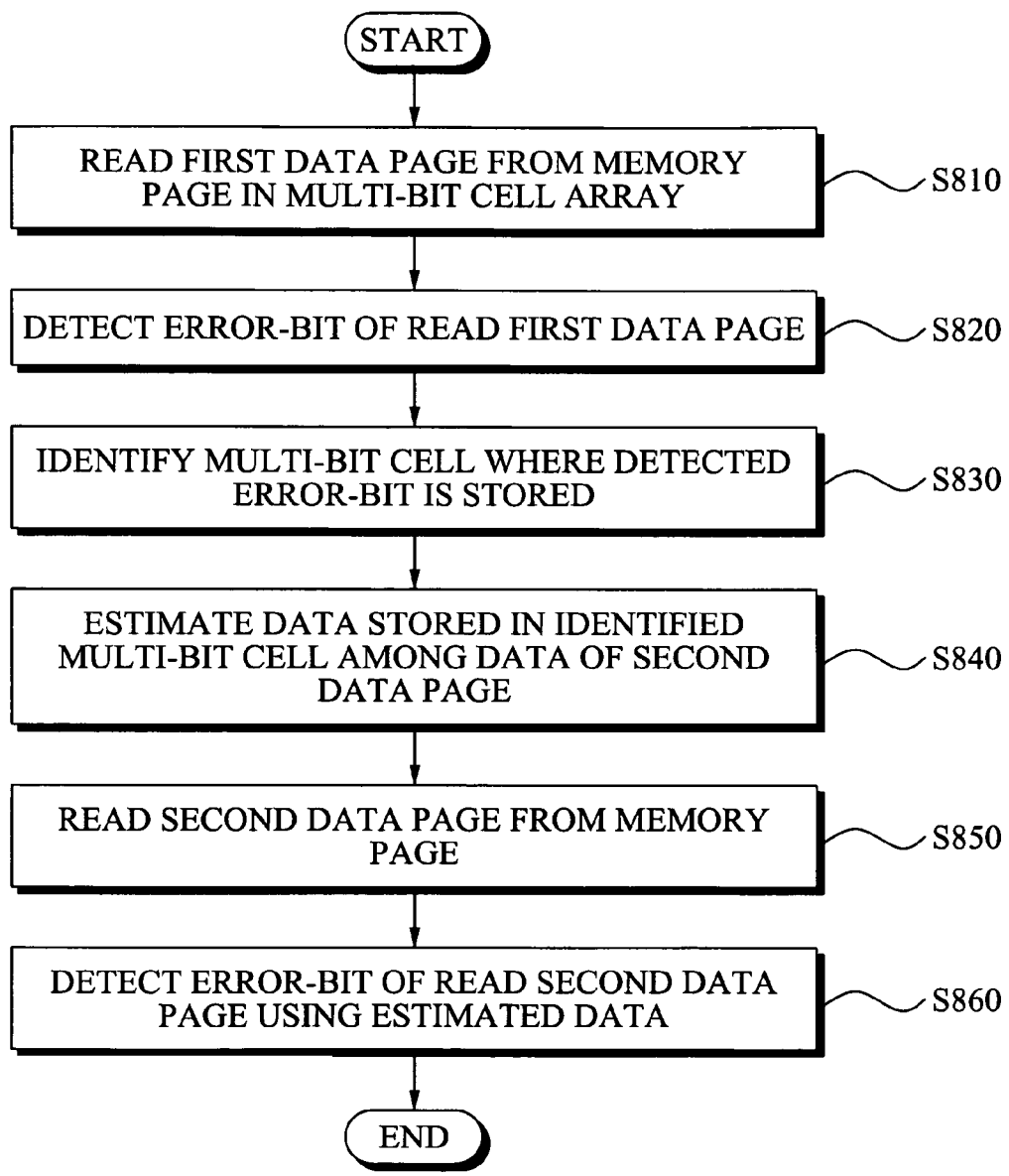
FIG. 8 is a flowchart illustrating a memory data reading method according to example embodiments.

FIG. 8 is a flowchart illustrating a memory data reading method According to example embodiments.

Referring to FIG. 8, a first data page may be read from a memory page in a multi-bit cell array in operation S810.

In operation S820, an error-bit of the read first data page may be detected.

In operation S830, a multi-bit cell where the detected error-bit is stored may be identified.

In operation S840, data of a second data page stored in the identified multi-bit cell may be estimated.

In operation S840, the data of the second data page stored in the identified multi-bit cell may be estimated based on an error-pattern of detected error-bits.

In operation S840, the data of the second data page stored in the identified multi-bit cell may be estimated based on a mapping relationship between data and a threshold voltage of the multi-bit cells in the multi-bit cell array.

In operation S850, the second data page may be read from the memory page.

In operation S860, an error-bit of the second data page that is read in operation S850 may be detected using the estimated data.

Figure 9:
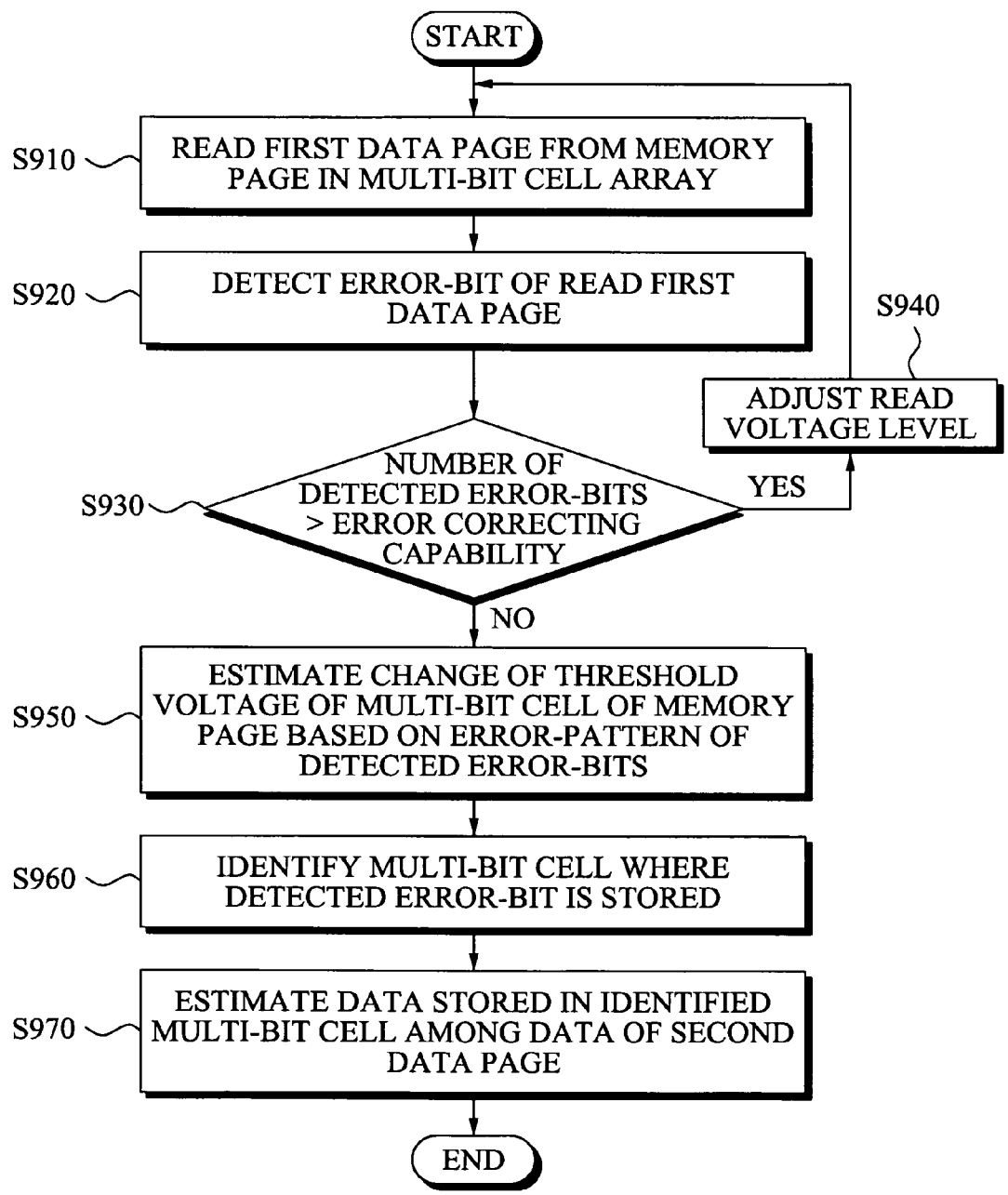
FIG. 9 is a flowchart illustrating a memory data reading method according to example embodiments.

FIG. 9 is a flowchart illustrating a memory data reading method according to another example embodiment.

Referring to FIG. 9, a first data page may be read from a memory page in a multi-bit cell array in operation S910.

In operation S920, an error-bit of the read first data page may be detected.

In operation S930, whether the number of the detected error-bits exceeds an error correcting capability may be determined.

In operation S940, read voltage levels may be adjusted when the determined result of operation S930 indicates that the number of the detected error-bits exceeds the error correcting capability.

In operation S910, the first data page may again be read using the read voltage levels adjusted in operation S940.

In operation S950, when the verified result of operation S930 indicates that the number of the detected error-bits does not exceed the error correcting capability, a threshold voltage of multi-bit cells in the memory page may be changed based on a pattern of detected error-bits.

In operation S960, the multi-bit cell where the detected error-bit is stored may be identified.

In operation S970, data of a second data page stored in the identified multi-bit cell may be estimated.

The memory data reading method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. The memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
an array of multi-bit nonvolatile memory cells;
an error detector configured to detect a first error in a first page of first-bit data read from a first plurality of multi-bit nonvolatile memory cells in said array during a first error detection operation and further configured to perform a second error detection operation on a second page of second-bit data read from the first plurality of multi-bit nonvolatile memory cells using an estimate of a second-bit datum in the second page of the second-bit data as a read data value having a higher priority of accuracy relative to other read data values within the second page of second-bit data; and
an estimator configured to identify a first multi-bit cell in the first plurality of multi-bit nonvolatile memory cells containing the first error and further configured to generate the estimate as a value of a second bit of data in the first multi-bit cell that is predicted by the first error.

2. The memory device of claim 1, wherein said estimator uses a mapping relationship between a threshold voltage of the first multi-bit cell containing the first error and a multi-bit data value associated with a different threshold voltage to generate the estimate.

3. The memory device of claim 1, wherein said error detector uses an error control code to detect the first error.

4. The memory device of claim 1, wherein said error detector is configured to use the estimate as a read data value having a higher priority of accuracy relative to all other read data values within the second page of second-bit data.

5. A nonvolatile memory device, comprising:
an array of nonvolatile memory cells configured to store M-bits of data per cell, where M is an integer greater than one;
a data estimator configured to generate an estimate of a second bit of data stored in a nonvolatile memory cell from an error detected in a first bit of data stored in the same nonvolatile memory cell during a first error detection operation performed on a first page of first-bit data read from a first plurality of nonvolatile memory cells in said array; and
an error detector configured to perform a second error detection operation on a second page of second-bit data read from the first plurality of multi-bit nonvolatile memory cells using the estimate of the second bit of data as a data value having a higher confidence of accuracy relative to other data values within the second page of second-bit data.

6. The memory device of claim 5, wherein the second bit of data is an LSB data bit and the first bit of data is an MSB data bit or vice versa.

7. The memory device of claim 5, wherein the first page of first-bit data is read from the first plurality of nonvolatile memory cells using a first read voltage level having a first magnitude to identify which first plurality of nonvolatile memory cells have threshold voltages above the first read voltage level and which first plurality of nonvolatile memory cells have threshold voltages below the first read voltage level; wherein the first bit of data stored in the nonvolatile memory cells corresponds to a first threshold voltage having a magnitude less than the first read voltage level; and wherein the estimate of the second bit of data corresponds to a second threshold voltage having a magnitude greater than the first read voltage level.

8. The memory device of claim 5, wherein the first page of first-bit data is read from the first plurality of nonvolatile memory cells using a first read voltage level having a first magnitude to identify which first plurality of nonvolatile memory cells have threshold voltages above the first read voltage level and which first plurality of nonvolatile memory cells have threshold voltages below the first read voltage level; wherein the first bit of data stored in the nonvolatile memory cells corresponds to a first threshold voltage having a magnitude greater than the first read voltage level; and wherein the estimate of the second bit of data corresponds to a second threshold voltage having a magnitude less than the first read voltage level.

* * * * *